(12) United States Patent
Zhou

(10) Patent No.: US 9,698,095 B2
(45) Date of Patent: Jul. 4, 2017

(54) INTERCONNECT STRUCTURE

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/838,604

(22) Filed: Aug. 28, 2015

(65) Prior Publication Data
US 2016/0049365 A1 Feb. 18, 2016

Related U.S. Application Data

(62) Division of application No. 14/106,961, filed on Dec. 16, 2013, now Pat. No. 9,153,480.

(30) Foreign Application Priority Data

Dec. 17, 2012 (CN) .......................... 2012 1 0550003

(51) Int. Cl.
*H01L 23/48* (2006.01)
*H01L 23/522* (2006.01)
*H01L 21/768* (2006.01)
*H01L 23/532* (2006.01)
*H01L 21/02* (2006.01)
*H01L 21/3105* (2006.01)

(Continued)

(52) U.S. Cl.
CPC ...... *H01L 23/5226* (2013.01); *H01L 21/0234* (2013.01); *H01L 21/02203* (2013.01); *H01L 21/02362* (2013.01); *H01L 21/3105* (2013.01); *H01L 21/31144* (2013.01); *H01L 21/7682* (2013.01); *H01L 21/76802* (2013.01); *H01L 21/76826* (2013.01); *H01L 21/76829* (2013.01); *H01L 21/76832* (2013.01); *H01L 23/29* (2013.01); *H01L 23/291* (2013.01); *H01L 23/296* (2013.01); *H01L 23/3157* (2013.01); *H01L 23/528* (2013.01); *H01L 23/5329* (2013.01); *H01L 23/53295* (2013.01); *H01L 2221/1047* (2013.01); *H01L 2924/0002* (2013.01)

(58) Field of Classification Search
CPC .......................... H01L 23/5226; H01L 23/528
See application file for complete search history.

(56) References Cited

U.S. PATENT DOCUMENTS 5,950,101 A 9/1999 Yano et al.
6,072,227 A 6/2000 Yau et al.
(Continued)

*Primary Examiner* — John C Ingham
*Assistant Examiner* — Wasiul Haider
(74) *Attorney, Agent, or Firm* — Anova Law Group, PLLC

(57) ABSTRACT

An interconnect structure and fabrication method are provided. A substrate can include a semiconductor device disposed therein. A porous dielectric layer can be formed on the substrate. A surface treatment can be performed to the porous dielectric layer to form an isolation layer on the porous dielectric layer to prevent moisture absorption of the porous dielectric layer. An interconnect can be formed at least through the isolation layer and the porous dielectric layer to provide electrical connection to the semiconductor device disposed in the substrate.

12 Claims, 5 Drawing Sheets

(51) Int. Cl.
*H01L 21/311* (2006.01)
*H01L 23/29* (2006.01)
*H01L 23/31* (2006.01)
*H01L 23/528* (2006.01)

(56) References Cited

U.S. PATENT DOCUMENTS

| | | | |
|---|---|---|---|
| 6,221,745 B1 * | 4/2001 | Fan | H01L 21/32137 257/E21.029 |
| 7,279,427 B2 | 10/2007 | Nishino et al. | |
| 7,851,232 B2 | 12/2010 | van Schravendijk et al. | |
| 8,173,537 B1 | 5/2012 | Chattopadhyay et al. | |
| 2002/0076935 A1 * | 6/2002 | Maex | G03F 7/094 438/706 |
| 2003/0111263 A1 | 6/2003 | Fornof et al. | |
| 2004/0214427 A1 | 10/2004 | Kloster et al. | |
| 2005/0233591 A1 * | 10/2005 | Schmitt | C23C 16/401 438/706 |
| 2007/0042580 A1 | 2/2007 | Al-Bayati et al. | |
| 2007/0224824 A1 | 9/2007 | Chen et al. | |
| 2008/0036083 A1 * | 2/2008 | Sawada | H01L 21/563 257/737 |
| 2008/0233745 A1 * | 9/2008 | Chang | H01L 21/28556 438/687 |
| 2009/0093112 A1 | 4/2009 | Al-Bayati et al. | |
| 2009/0141767 A1 * | 6/2009 | Cummins | G01N 27/223 374/142 |
| 2010/0136789 A1 | 6/2010 | Matz et al. | |
| 2012/0306093 A1 | 12/2012 | Engel et al. | |
| 2013/0105996 A1 * | 5/2013 | Brink | H01L 21/76802 257/786 |
| 2013/0127055 A1 * | 5/2013 | Chen | H01L 23/53238 257/751 |
| 2013/0256888 A1 * | 10/2013 | Shih | H01L 23/485 257/741 |
| 2014/0070418 A1 * | 3/2014 | Cabral, Jr. | H01L 23/53238 257/751 |

* cited by examiner

INTERCONNECT STRUCTURE

CROSS REFERENCE TO RELATED APPLICATIONS

This application is a divisional of U.S. patent application Ser. No. 14/106,961, filed on Dec. 16, 2013, which claims the priority to Chinese Patent Application No. CN201210550003.3, filed on Dec. 17, 2012, all of which are incorporated herein by reference in their entirety.

FIELD OF THE DISCLOSURE

The present disclosure generally relates to the field of semiconductor technology and, more particularly, relates to interconnect structures and their fabrication methods.

BACKGROUND

Currently, one of the challenges of integrated circuit design and manufacturing is to reduce resistive capacitive delay during signal transmission. One solution is to replace an aluminum layer with a copper layer to lower the serial metal resistance. Another solution is to form low-k porous films or air gaps between the metal layers to reduce the parasitic capacitance.

FIG. 1 shows a conventional method for fabricating an interconnect structure. The fabrication method includes: providing a substrate 5 and forming semiconductor devices on the substrate 5; depositing a low-k film 4 on the substrate 5; forming a mask 6 on the low-k film 4; patterning the low-k film 4 using the mask 6 to create through-holes (not illustrated); and filling the through-holes with metal to create an interconnect structure connecting to the semiconductor devices. Specifically, the low-k film 4 is porous and the mask 6 is a hard mask.

In practice, however, conventional interconnect structures often have bump defects. Such bump defects may lower production yield of the interconnect structures and may affect electric connection of the interconnect structures.

BRIEF SUMMARY OF THE DISCLOSURE

One aspect of present disclosure includes a method for forming an interconnect structure. A porous dielectric layer can be formed on a substrate having a semiconductor device disposed in the substrate. A surface treatment can be performed to the porous dielectric layer to form an isolation layer on the porous dielectric layer to prevent moisture absorption of the porous dielectric layer. An interconnect can be formed at least through the isolation layer and the porous dielectric layer to provide electrical connection to the semiconductor device in the substrate.

Another aspect of present disclosure includes an interconnect structure having a substrate with a semiconductor device disposed therein. A porous dielectric layer can be disposed on the substrate. An isolation layer can be disposed on the porous dielectric layer by a surface treatment of the porous dielectric layer to prevent moisture absorption of the porous dielectric layer. An interconnect can be disposed at least through the isolation layer and the porous dielectric layer to provide electrical connection to the semiconductor device in the substrate.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It is observed that when a porous dielectric layer is generated in an interconnect structure, the porous dielectric layer is ready to absorb moisture from surrounding environment due to its porosity structure. Residues of the absorbed moisture can be on surface of the porous dielectric layer. Bump defects can be generated on where the moisture is absorbed, upon deposition of other layer(s) on the porous dielectric layer.

Accordingly, the present disclosure provides a method for fabricating an interconnect structure. After creation of a porous dielectric layer, an isolation layer is formed on surface of the porous dielectric layer to protect the porous dielectric layer from absorbing moisture without further generating bump defects. The fabrication method can include, for example, forming a porous dielectric layer on a substrate, performing surface treatment to the porous dielectric layer to form an isolation layer, and forming one or more hard masks on the isolation layer.

FIGS. 2-7 are schematics illustrating an exemplary method for forming an interconnect structure in accordance with various disclosed embodiments.

Figure 1:
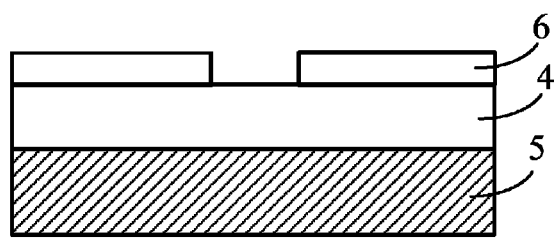
FIG. 1 depicts a conventional method for fabricating an interconnect structure.
Figure 2:
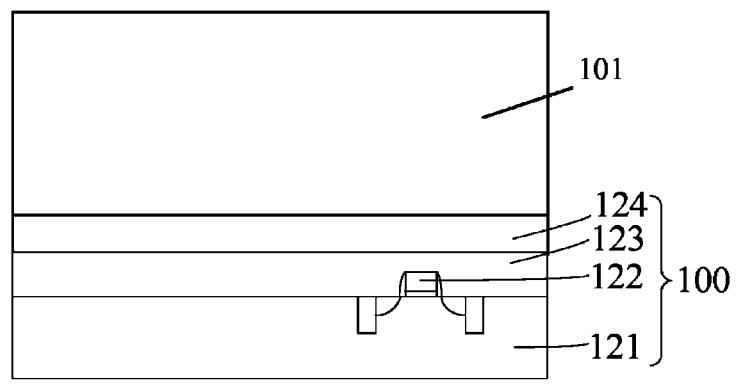
FIGS. 2-7 are schematics illustrating an exemplary method for forming an interconnect structure in accordance with various disclosed embodiments.

In FIG. 2, a substrate 100 is provided including a supporting base 121 having semiconductor devices 122 (e.g. transistors) formed on the supporting base 121; a metal layer 123 formed on the supporting base 121 and the semiconductor devices 122; and a barrier layer 124 formed on the metal layer 123. The metal layer 123 is electrically connected to other semiconductor devices through an interconnect (not illustrated in FIG. 2).

The barrier layer 124 is used to prevent metal diffusion from the metal layer 123. In one embodiment, the metal layer 123 is made of copper and/or aluminum, and the barrier layer 124 is made of nitrogen-doped silicon carbide (NDC). However, the materials used for the metal layer 123 and the barrier layer 124 are not limited in accordance with various embodiments.

Still as shown in FIG. 2, a dielectric material 101 is deposited on the substrate 100. In this exemplary embodiment, the dielectric material 101 is resulted from dimethyldiethoxysilane and atom transfer radical polymerization. For example, a sol-gel process can be employed to form the dielectric material 101. In other embodiments, the dielectric material 101 can be made of $SiO_2$, SiOF, SiCOH, SiO, SiCO, SiCON, and/or black diamond(s). A chemical vapor deposition process can be used to deposit the dielectric material 101. The materials and methods used for making the dielectric material 101 are not limited.

Figure 3:
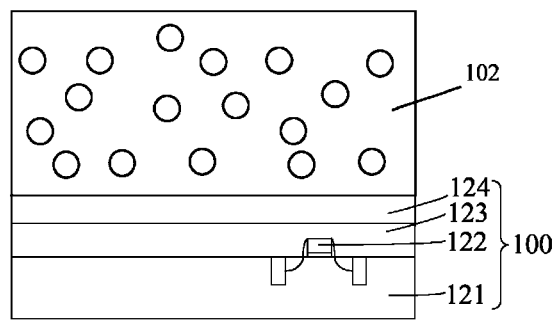

In FIG. 3, the dielectric material 101 is UV treated to form a porous dielectric layer 102. For example, a porous structure is developed in the dielectric material in response to the UV light and/or the UV-generated heat to form a porous dielectric layer 102. The methods used for forming the porous dielectric layer 102 are not limited. Any other suitable methods can be employed to form the porous dielectric layer 102.

Figure 4:
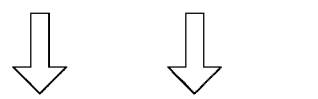
Figure 4:
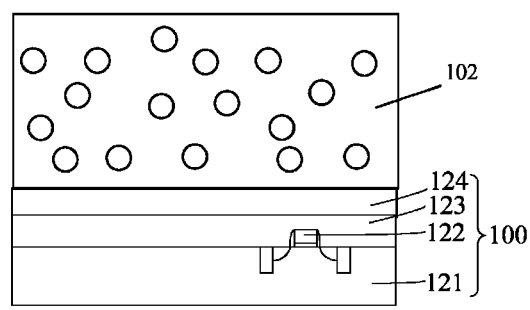
Figure 5:
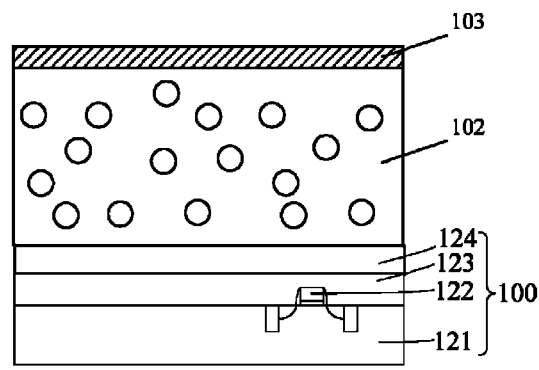

Referring to FIGS. 4 and 5, surface treatment is performed on the porous dielectric layer 102 to create an isolation layer 103. Such isolation layer 103 is utilized to reduce or eliminate moisture uptake on the porous dielectric layer 102. In an exemplary embodiment, the isolation layer 103 is a dense film containing C, H, O, and/or Si, although other element(s) can be included in the isolation layer 103. As long as the isolation layer 103 is denser than the porous dielectric layer 102, moisture absorption by the porous dielectric layer 102 can be reduced or eliminated. Accordingly, bump defects in the interconnect structure can be avoided.

In an exemplary embodiment, the surface treatment on the porous dielectric layer 102 for forming the isolation layer 103 can be performed using ozone and dimethyldiethoxysilane ($C_5H_{14}O_2Si$) (e.g., which can include octamethylcyclotetrasiloxane, tetraethyl orthosilicate, and/or silane). The formed isolation layer 103 can thus be made of using ozone and dimethyldiethoxysilane ($C_5H_{14}O_2Si$) to treat the material of a surface portion of the porous dielectric layer 102. The isolation layer 103 has a density sufficiently high to prevent moisture absorption. The materials used for the surface treatment and/or for constituting the isolation layer 103 are not limited. Other suitable materials and/or treatment processes can be employed for forming the isolation layer 103. For instance, an isolation layer 103 can be made of silicon dioxide.

It should be noted that excessive supply of ozone and/or dimethyldiethoxysilane is wasteful, while insufficient supply thereof can reduce isolation effectiveness of the isolation layer 103. Accordingly, the surface treatment utilizing ozone and dimethyldiethoxysilane can include a chamber pressure ranging from about 4 torr to about 7 torr, a power from about watts 50 to about 500 watts, and a flow rate of ozone and dimethyldiethoxysilane from about 100 sccm to about 1000 sccm. The carrier gas used can be gas He with a flow rate of about 100 sccm to about 2000 sccm. However, other suitable carrier gas(es) can be used without limitation, for example, the carrier gas can include Ar.

In one embodiment, surface treatment using ozone and dimethyldiethoxysilane can be conducted in-situ on the porous dielectric layer 102 in a same chamber used for the UV treatment process, such that there is no need to move the interconnect structure from the vacuum chamber for forming the porous dielectric layer 102 to any other chambers for forming the isolation layer 103. The in-situ surface treatment process allows a simplified process with reduced fabrication steps. In other embodiments, the surface treatment for forming the isolation layer 103 may not be carried out in situ in the UV-treatment process chamber for forming the porous dielectric layer 102 and may be performed in a separate reaction chamber using a separate processing step.

In various embodiments, prior to the surface treatment employing ozone and dimethyldiethoxysilane for forming the isolation layer 103, pre-treatment using ozone can be performed on the porous dielectric layer 102. Such pre-treatment using ozone on the porous dielectric layer 102 can enhance the adhesion between the formed isolation layer 103 and the porous dielectric layer 102. This provides a more compact bonding between the isolation layer 103 and the porous dielectric layer 102 compared with the semiconductor structure without using pre-treatment on the porous dielectric layer 102. Quality and mechanical strength of the formed semiconductor structure can be enhanced, and moisture penetration/bump defects can be prevented.

Excessive ozone supply can be wasteful, while insufficient ozone supply cannot improve the adhesion between the isolation layer 103 and the porous dielectric layer 102. Accordingly, the pre-treatment using ozone can use a chamber pressure ranging from about 4 torr to about 7 torr, a power ranging from about 50 watts to about 500 watts, and a flow rate ranging from about 100 sccm to about 1000 sccm. Also, the pre-treatment process using ozone can be performed in-situ on the porous dielectric layer 102 in the UV-treatment chamber.

Figure 6:
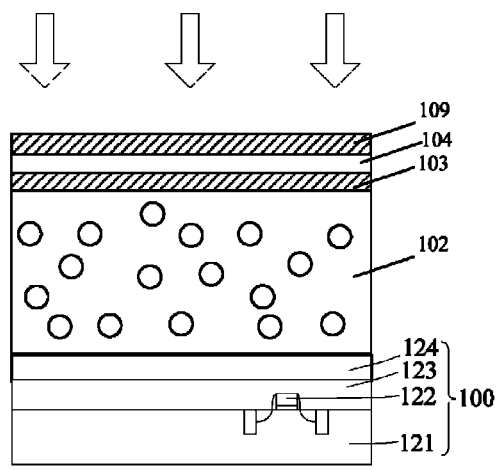
Figure 7:
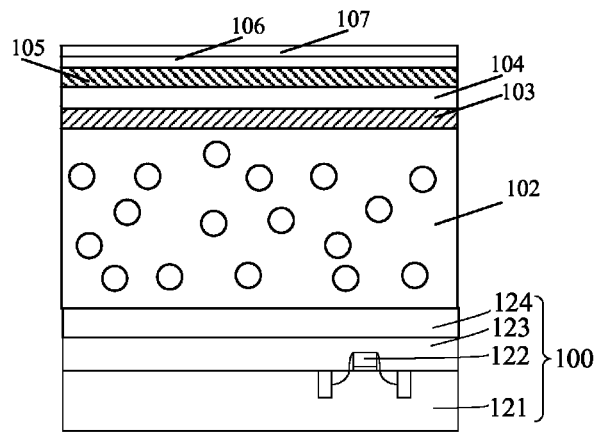

As shown in FIGS. 6-7, hard mask layers are formed on the isolation layer 103. For example, a porous dielectric hard mask 104, a TEOS (i.e., tetraethyl orthosilicate, $Si(OC_2H_5)_4$) hard mask 105, a metal hard mask 106, and a silicon oxide hard mask 107 are sequentially formed on the isolation layer 103, as shown in FIG. 7. Each hard mask layer (e.g., 104, 105, 106, or 107) can be omitted, modified, and re-arranged. Other suitable layer(s) or hard mask layer(s) can be added.

For example, after the porous dielectric hard mask 104 is formed on the isolation layer 103 as shown in FIG. 6, surface treatment can be performed on the porous dielectric hard mask 104 to optionally generate a second isolation layer 109 on the porous dielectric hard mask 104 to further reduce moisture uptake by the porous dielectric layer 102 to further reduce or eliminate bump defects formed thereon. Such surface treatment can be performed using ozone and dimethyldiethoxysilane (e.g., the dimethyldiethoxysilane can include octamethylcyclotetrasiloxane, tetraethyl orthosilicate, and silane) to generate the optional second isolation layer 109 made of $C_5H_{14}O_2Si$. For example, this surface treatment on the porous dielectric hard mask 104 can be performed having a chamber pressure ranging from about 4 torr to about 7 torr, a power ranging from about 50 watts to about 500 watts, a flow rate ranging from about 100 sccm to about 1000 sccm for ozone and dimethyldiethoxysilane, and a flow rate ranging from about 100 sccm to about 2000 sccm for a carrier gas (e.g., He).

In some embodiments, pre-treatment using ozone can be performed prior to the surface treatment of the porous dielectric hard mask 104. For example, ozone and dimethyldiethoxysilane can be employed to enhance adhesion between the isolation layer (not illustrated) and the porous dielectric hard mask 104. This further provides a more compact bonding between the isolation layer and the porous dielectric hard mask 104. Quality and mechanical strength of the formed semiconductor structure can further be enhanced, and moisture penetration/bump defects on the porous dielectric layer 102 can be prevented. In one embodiment, such pre-treatment on the porous dielectric hard mask 104 can use a chamber pressure ranging from about 4 torr to about 7 torr, a power ranging from about 50 watts to about 500 watts, and a flow rate ranging from about 100 sccm to about 1000 sccm.

An interconnect 131 can then be formed at least through the isolation layer 103, the porous dielectric layer 102, and the barrier layer 124 to connect to the metal layer 123 such that the interconnect 131 can provide electrical connection between the semiconductor device 122 and other semiconductor devices.

Figure 8A:
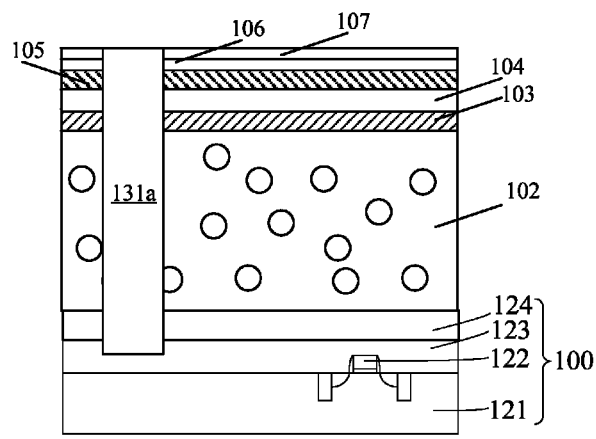
FIGS. 8A-8C depict exemplary interconnect structures in accordance with various disclosed embodiments.

For example, the hard masks 104, 105, 106, and/or 107 in FIG. 7 can be patterned and used as an etch mask to form a through-hole at least through the isolation layer 103, the porous dielectric layer 102, the barrier layer 124 in the substrate 100, and/or a portion of the metal layer 123 in the substrate 100 by suitable etching process(es) to expose the metal layer 123 in the substrate 100. The through-hole can then be filled with metal material to form an electrical interconnection, such as the interconnect 131*a* as shown in FIG. 8A.

Figure 8B:
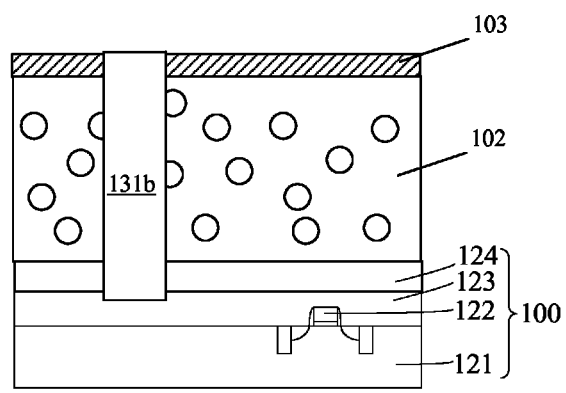

In various embodiments, one or more layers of the hard masks 104, 105, 106, and/or 107 can be selected and removed from the processed structure. For example, as shown in FIG. 8B, all of the hard masks can be removed to expose the isolation layer 103 for manufacturing an interconnection 131*b* through the isolation layer 103, the porous dielectric layer 102, the barrier layer 124, and/or a portion of the metal layer 123 to connect to the metal layer 123. The interconnection 131*b* can electrically connect the semiconductor device 122 and other suitable semiconductor devices (not shown).

In other examples, the hard masks 107, 106, and/or 105 can be removed depending on specific requirements for the interconnect structure, e.g., for forming a device having a compact structure (not shown) including an interconnect formed through the porous dielectric hard mask 104, the isolation layer 103, the porous dielectric layer 102, and the barrier layer 124 to connect to the metal layer 123.

Figure 8C:
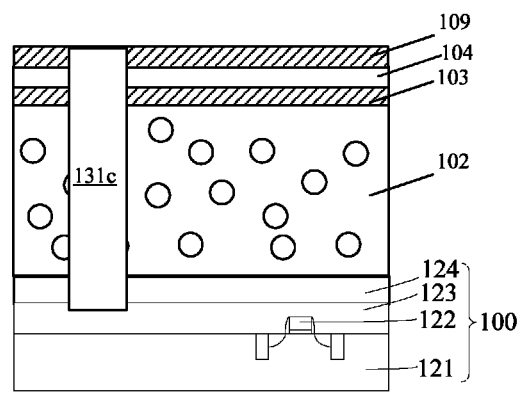

In still other examples, alternating layers of an isolation layer (e.g., 109, 103, etc.) and a porous dielectric layer (e.g., 104, 102, etc.) can be formed on the substrate 100. An interconnect (e.g., interconnect 131*c* as shown in FIG. 8C) can be formed through a plurality of the alternating layers (including an isolation layer and a porous dielectric layer), the barrier layer 124, and a portion of the metal layer 123 to establish electrical connections between the semiconductor device 122 and other suitable semiconductor devices (not shown).

The interconnect structures and their fabrication methods can reduce or eliminate bump defects formed on the porous dielectric layer to increase production yield of the interconnect structures and to improve electrical connection reliability of the interconnect structures.

Other applications, advantages, alternations, modifications, or equivalents to the disclosed embodiments are obvious to those skilled in the art.

What is claimed is:

1. An interconnect structure, comprising:
    a substrate comprising a semiconductor device disposed therein;
    a non-compacted porous dielectric layer disposed on the substrate;
    a first compacted isolation layer on the non-compacted porous dielectric layer, wherein the first compacted isolation layer is a product made by using ozone and diethoxymethylsilane to treat a layer of a material selected from $SiO_2$, SiOF, SiO, SiCO SiCON, or a combination thereof, wherein:
    the first compacted isolation layer has a density sufficiently higher than the non-compacted porous dielectric layer; and
    an interconnect disposed at least through the first compacted isolation layer and through the non-compacted porous dielectric layer to provide electrical connection to the semiconductor device in the substrate.

2. The structure of claim 1, further comprising:
    a porous dielectric hard mask on the first compacted isolation layer,
    a tetraethyl orthosilicate (TEOS) hard mask on the porous dielectric hard mask,
    a metal hard mask on the TEOS hard mask, and
    a silicon oxide hard mask on the metal hard mask.

3. The structure of claim 2, further comprising,
    a second compacted isolation layer on the porous dielectric hard mask to prevent moisture absorption, wherein:
    the second compacted isolation layer is a product made by using ozone and diethoxymethylsilane to treat a top portion of the porous dielectric hard mask being on the first compacted isolation layer, and
    the TEOS hard mask is on the second compacted isolation layer being on the porous dielectric hard mask.

4. The structure of claim 1, wherein the non-compacted porous dielectric layer is made of a material comprising $SiO_2$, SiOF, SiO, SiCO, SiCON, or a combination thereof.

5. The structure of claim 1, wherein the substrate comprises:
    a supporting base having the semiconductor device formed thereon,
    a metal layer disposed over the supporting base and the semiconductor device, and
    a barrier layer disposed over the metal layer.

6. The structure of claim 5, wherein the interconnect is disposed through the first compacted isolation layer, the non-compacted porous dielectric layer, and the barrier layer to connect to the metal layer to provide electrical connection to the semiconductor device in the substrate.

7. The structure of claim 3, wherein an interconnect is disposed through the second compacted isolation layer, the porous dielectric hard mask, the first compacted isolation layer, and the non-compacted porous dielectric layer, to connect to a metal layer in the substrate to provide an electrical connection to a semiconductor device in the substrate.

8. The structure of claim 3, further comprising:
    an additional porous dielectric layer; and
    an additional compacted isolation layer being a product made by using ozone and diethoxymethylsilane to treat a top portion of the additional porous dielectric layer, wherein:
    the TEOS hard mask is on the additional compacted isolation layer being on the additional porous dielectric layer; and
    an interconnect is disposed through the additional compacted isolation layer and the additional porous dielectric layer to provide electrical connection to a metal layer of a semiconductor device in the substrate.

9. The structure of claim 1, wherein the porous dielectric layer further includes a black diamond.

10. The structure of claim 1, wherein the first compacted isolation layer is in direct contact with the non-compacted remaining portion of the porous dielectric layer.

11. The structure of claim 1, wherein the diethoxymethylsilane further includes octamethylcyclotetrasiloxane, tetraethyl orthosilicate, and silane.

12. The structure of claim 1, wherein:
    sidewalls of the first compacted isolation layer and sidewalls of the non-compacted porous dielectric layer are formed in a same etching process, and
    the interconnect is in contact with the sidewalls of the first compacted isolation layer and sidewalls of the non-compacted porous dielectric layer.

* * * * *